(12) United States Patent
Xu et al.

(10) Patent No.: US 7,642,164 B1
(45) Date of Patent: Jan. 5, 2010

(54) METHOD OF FORMING SELF ALIGNED CONTACTS FOR A POWER MOSFET

(75) Inventors: Robert Q. Xu, Fremont, CA (US); Jacek Korec, San Jose, CA (US)

(73) Assignee: Vishay-Siliconix, Santa Clara, CA (US)

( * ) Notice: Subject to any disclaimer, the term of this patent is extended or adjusted under 35 U.S.C. 154(b) by 98 days.

(21) Appl. No.: 10/951,831

(22) Filed: Sep. 27, 2004

Related U.S. Application Data

(62) Division of application No. 10/254,385, filed on Sep. 24, 2002.

(51) Int. Cl.
 *H01L 21/336* (2006.01)
(52) U.S. Cl. ............... 438/270; 438/589; 257/E21.001
(58) Field of Classification Search ............... 438/270, 438/589; 257/E21.001
See application file for complete search history.

(56) References Cited

U.S. PATENT DOCUMENTS

| | | | |
|---|---|---|---|
| 5,055,896 A | 10/1991 | Williams et al. | |
| 5,430,315 A | 7/1995 | Rumennik et al. | ........... 257/331 |
| 5,567,634 A | 10/1996 | Hebert et al. | ................. 437/41 |
| 6,268,242 B1 | 7/2001 | Williams et al. | |
| 6,277,695 B1 | 8/2001 | Williams et al. | |
| 6,861,701 B2 * | 3/2005 | Williams et al. | ............. 257/329 |
| 2002/0074585 A1 | 6/2002 | Tsang et al. | ................. 257/302 |

FOREIGN PATENT DOCUMENTS

| | | |
|---|---|---|
| EP | 0 620 588 A2 | 10/1994 |
| EP | 1 186 023 A0 | 3/2002 |
| JP | 2002016080 | 1/2002 |
| JP | 2002110978 | 4/2002 |
| WO | 0199177 | 12/2001 |

* cited by examiner

*Primary Examiner*—Jack Chen

(57) ABSTRACT

A method for providing self aligned contacts for a trench power MOSFET is disclosed. The method includes, etching trenches in a substrate through a mask of silicon nitride deposited on an oxide layer, forming a gate oxide layer on the walls of the trenches, applying polysilicon to fill the trenches and to cover the surface of the mask of silicon nitride, removing the polysilicon from the surface of the mask of silicon nitride and applying a photoresist mask to cover a location of a gate bus. The method further includes recessing polysilicon plugs formed in trenches that are located in the active area to form recesses above the polysilicon plugs, filling recesses formed above the polysilicon plugs formed in trenches that are located in the active area with an insulator, applying a fourth photo resist mask to define contact windows that are opened in the nitride layer, and selectively etching the silicon nitride film and leaving flat surfaced oxide buttons covering the trenches that are located in the active area. Moreover, electric contact trenches are defined using self-aligned spacer operations, and a fifth photo resist mask is applied to pattern metal contacts that reach the semiconductor device active areas.

10 Claims, 14 Drawing Sheets

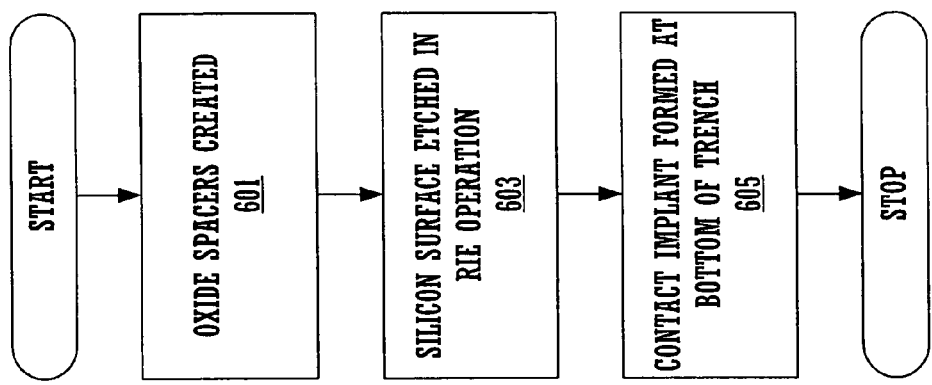

METHOD OF FORMING SELF ALIGNED CONTACTS FOR A POWER MOSFET

TECHNICAL FIELD

Embodiments of the present invention relate generally to methods for forming contacts in the fabrication of semiconductor devices. In particular, an embodiment of the present invention relates to a method for forming self-aligned contacts for a power MOSFET.

BACKGROUND ART

Contacts facilitate the electrical connection of semiconductor device components. Various methods and means may be employed in the forming of such contacts including photolithography. Photolithographic processes are often employed to pattern various layers on a wafer in order to produce circuit features positioned as specified in a circuit diagram. Such processes generally entail operations such as depositing a layer of photoresist onto a layer to be patterned, and exposing the photoresist using an exposure tool and a template. These templates are known as reticles or masks. During the exposure process, the reticle is imaged onto the photoresist by directing radiant energy (e.g., ultraviolet light) through the reticle. The image projected onto the photoresist selectively exposes it in a desired pattern.

Exposure tools may be limited in their capacity to facilitate the proper dimensioning and alignment of contact structures in the semiconductor device fabrication process. One limitation of such exposure tools is their resolution limit. The resolution limit of an exposure tool is defined as the minimum feature dimension that the exposure tool can repeatedly expose onto the resist, and is a function of amongst other things its depth of focus. In addition, limitations in the alignment capability of the exposure tool may be exposed by the necessity of precisely aligning the respective structures that constitute the semiconductor device. The misalignment of such device structures may result in a fatal defect of the semiconductor device.

Utilizing the aforementioned exposure tools, there are two methods of making contact to the gate material filling the trenches in a trench power MOSFET. The first method illustrated schematically in FIG. 1 requires the use of a mask (not shown) to pattern a polysilicon layer 101 after it is deposited onto substrate 103 and fills trench grooves 104 formed in substrate 103. In the area of the main device, called the active area, the polysilicon is etched back with a recess formed in the polysilicon material filling the trench grooves as relative to the front surface of the silicon substrate. In the area of the gate bus, the polycrystalline layer of the deposited silicon is patterned so that a portion of the layer is in electrical contact with the material filling the trench located there. An extension of this layer 101a is formed on the surface of a thick oxide layer 105, called field oxide, where contact can be made to gate bus metal 107. In the termination area the polysilicon film can be etched away or left to form field plates in the edge termination region. If the polysilicon film is etched away, a metal stripe 109 along the edge of the die may provide the function of the field plate electrode, as is shown in FIGS. 1 and 2. Also shown in FIG. 1 is source contact 111, source regions 113, contact implants 115, and body well 117.

The second method is illustrated by FIG. 2. This method does not employ a polysilicon mask, as the polysilicon layer is etched back from the entire front surface of the substrate during the device fabrication process. In addition, the trench is formed wider locally within the gate bus area, which facilitates easy contact to be made to the polysilicon material filling the wide trench 201.

A drawback of the first method is the large height differences found in the topology of the front surface. Because of the restricted depth of focus of exposure tools, the uneven topography of the real estate surrounding the gate bus area presents a severe limitation to the minimum feature size which can be printed by photolithography. This is because the differences in the height dimensions that are presented by such topologies test the resolution limit of exposure tools. The second method solves the issue of the height difference in the surface topology but has to rely on the alignment capability of the exposure tool, where even a small misalignment may result in an increased danger of leakage current or even an electric short between the gate and source electrodes. Moreover, the second method does not facilitate an easy integration of polysilicon devices with the main MOSFET, as the entire polysilicon layer from which such may be formed is etched away.

SUMMARY OF THE INVENTION

Accordingly, a need exists for a method for providing self aligned contacts while providing a flat surface for all critical exposures of photoresist masks. The present invention provides a method which accomplishes the above mentioned need.

For instance, one embodiment of the present invention provides a method and system for providing a self aligned trench power MOSFET is disclosed. The method includes, etching trenches in a substrate through a mask of silicon nitride deposited on an oxide layer, forming a gate oxide layer on the walls of the trenches, applying polysilicon to fill the trenches and to cover the surface of the mask of silicon nitride, removing the excess of polysilicon from the surface of the silicon nitride mask by CMP, and applying a photoresist mask to cover a location of a gate bus. The method further includes recessing polysilicon plugs formed in trenches that are located in the active area to form recesses above the polysilicon plugs, filling recesses formed above the polysilicon plugs formed in trenches that are located in the active area with an insulator, applying a fourth photo resist mask to define contact windows that are opened in the nitride layer, and selectively etching the silicon nitride film and leaving flat surfaced oxide buttons covering the trenches that are located in the active area. Moreover, electric contact trenches are defined using self-aligned spacer operations, and a fifth photo resist mask is applied to pattern metal contacts that reach the semiconductor device active areas. A flat surface is provided for all critical exposures of the photo resist masks.

In one embodiment the method provides for the integration of semiconductor devices (diodes) formed in a wide trench. The wide trench is filled with a polycrystalline film having a semiconductor device formed therein that is integrated with a transistor formed in the active transistor area.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 6 is a flowchart of steps performed in a self aligned spacer method according to one embodiment of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Forming Self Aligned Contacts for a Trench Power MOSFET

FIGS. 3A-3E illustrate a MOSFET fabricating process featuring the provision of self aligned contacts in accordance with one embodiment of the present invention. Exemplary embodiments of the present invention, provide self aligned contacts that may be formed by shielding previously formed structures with photoresist masks that resist the etchant that may be used to form spaces for the self-aligned contacts. The protective layer shields the underlying previously formed structures from the etchant, which effectively prevents the etchant from etching away material occupying the area surrounding the structures that are protected. Thus, the alignment of the mask to the previously formed structures may be much less critical and may consequently be termed "self aligned". According to exemplary embodiments, a flat surface may be provided for all critical exposures of the photoresist masks (as described herein), facilitating the production of high density, fine patterned structures, while avoiding problems related to the fine alignment of the exposure tool that may arise when patterning surfaces that present significant height variance (see FIGS. 3A-3E below).

Figure 1:
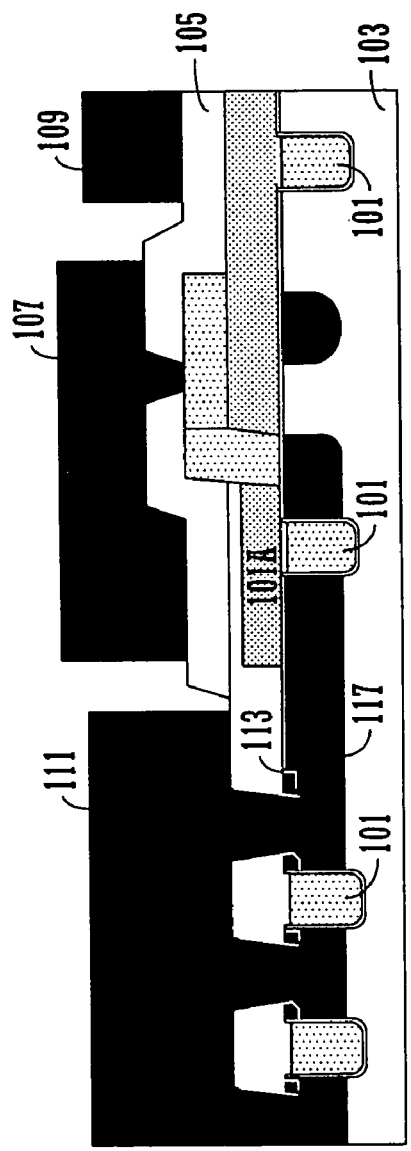
FIG. 1 shows a conventional method of making contact to the gate material filling the trenches in a trench power MOSFET.
Figure 2:
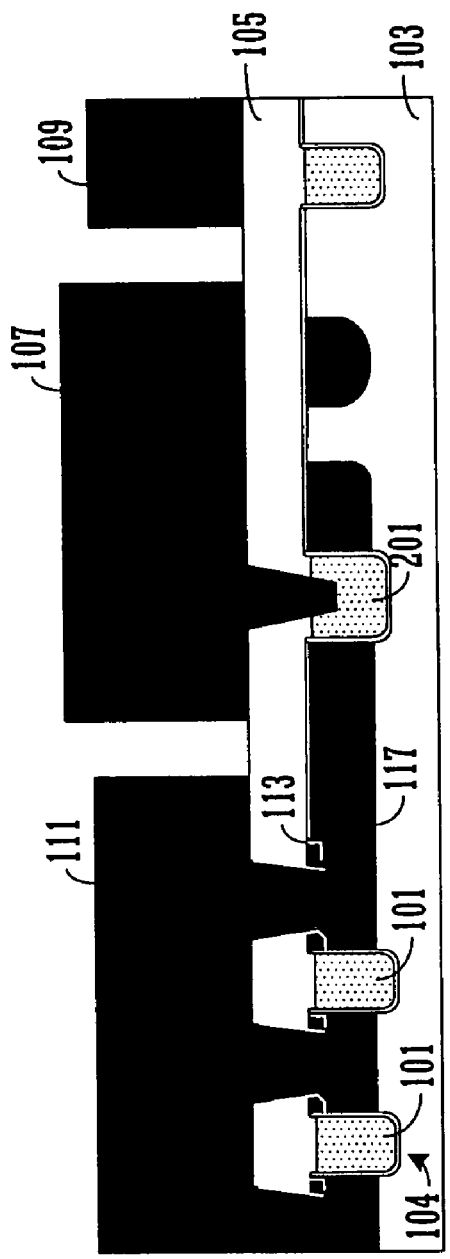
FIG. 2 shows a conventional method of making contact to the gate material filling the trenches in a trench power MOSFET.
Figure 3A:
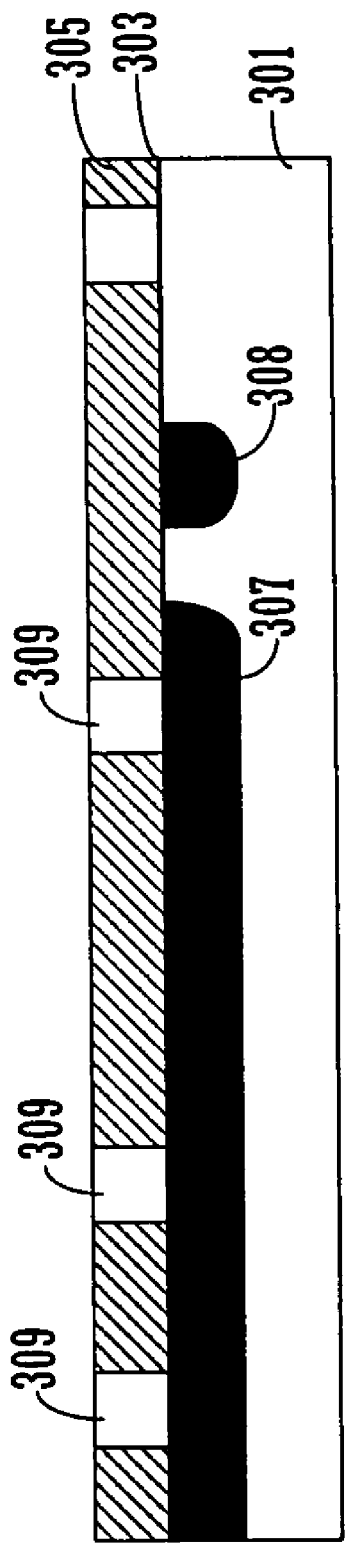
FIG. 3A shows a substrate patterned with a hard mask for facilitating the etching of trench grooves according to one embodiment of the present invention.

FIG. 3A shows a substrate 301 patterned with a hard mask ($2^{nd}$ photo resist mask) for facilitating the etching of trench grooves according to one embodiment of the present invention. A first photo resist mask (not shown) may be employed to define the structure of the edge termination components of the device such as is illustrated in FIG. 3A by floating ring 308. FIG. 3A shows substrate 301, pad oxide layer 303, silicon nitride film 305, body well 307, floating ring 308 and mask openings 309. Substrate 301 facilitates the formation of semiconductor device structures. According to exemplary embodiments, the substrate may be formed from silicon and may utilize implantation processes to form body well 307. Silicon Nitride film 305 and Pad-Oxide layer 303 form a hard mask including mask openings 309 that may be utilized in the formation trench grooves (see FIG. 3B).

Figure 3B:
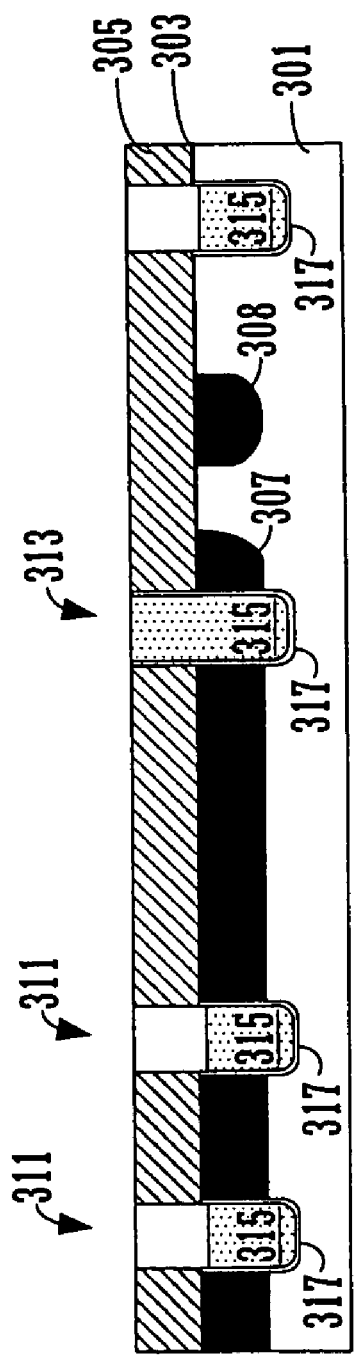
FIG. 3B illustrates a trench formation process according to one embodiment of the present invention.

FIG. 3B illustrates a trench formation process according to one embodiment of the present invention. FIG. 3B shows in addition to structures enumerated in the discussion of FIG. 3A, active area trenches 311, gate area trench 313, polycrystalline film 315, and gate oxide 317. According to exemplary embodiments, a dry etching process may be employed in the formation of the trenches. According to one embodiment, a reactive ion etching (RIE) process may be employed to form the trenches. After the trenches have been formed, the deposition of a gate oxide 317 lining the trench walls may be performed. A polycrystalline film 315 may then be deposited over the gate oxide layer 317 to fill the trench grooves and to form gate material within the trenches. Excess polysilicon may thereafter be removed from the surface of the SiN layer 305 of the hard mask by CMP, leaving a flat exposure surface.

A photoresist mask (third) may then be applied to the resultant surface to distinguish between the active area of the main MOSFET and a future gate bus area. The polysilicon film 315 may be thereafter recessed below the front surface of the silicon substrate in the main MOSFET region by selective dry etching. This leaves the polycrystalline film 315 occupying the active area trenches 311 recessed while the polycrystalline film 315 occupying the gate area trench 313 remains coincident with the top surface of the SiN layer 305 of the hard mask.

Figure 3C:
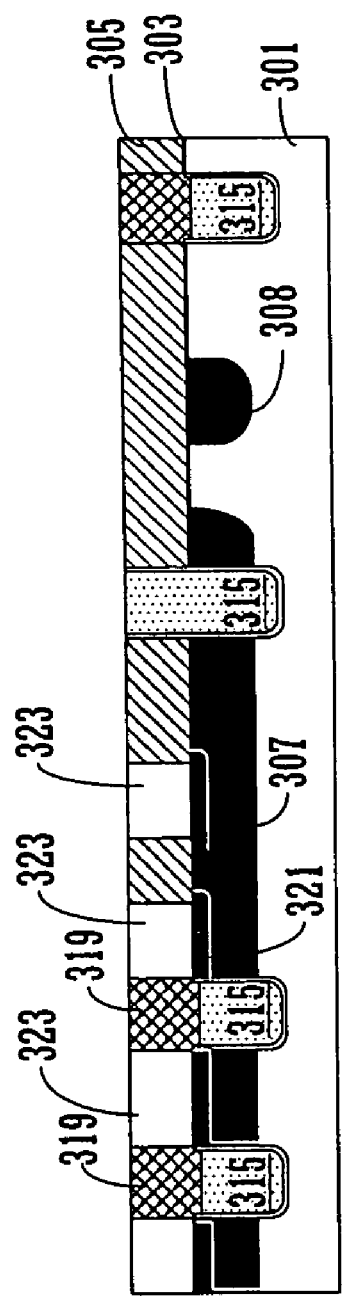
FIG. 3C illustrates source implantation processes in accordance with embodiments of the present invention.

FIG. 3C illustrates a source implantation processes in accordance with embodiments of the present invention. FIG. 3C shows in addition to structures enumerated in the discussion of FIGS. 3A and 3B above, insulator film 319, source regions 321, and contact windows 323. Insulator film 319 may be deposited and planarized by CMP to fill the voids above the recessed polysilicon. A fourth photo resist mask may then be applied to this flat surface to define the contact windows 323 that may be opened in the nitride layer to facilitate the implantation of source regions 321. In the active area, the SiN film may thereafter be, etched away selectively leaving oxide buttons covering the trenches (see FIG. 3C). The opened contact windows 323 may be used to facilitate the implantation of source regions 321 and to implant an additional body dose to fix the threshold voltage. This may be required after a dopant redistribution between silicon and gate oxide that can occur at the trench walls. It should be appreciated that the implanted source and body dopants may be electrically activated using an RTA s (Rapid Thermal Annealing) process. Moreover, an implantation window may also be opened some distance from the trenches, to enable the remote contacting of the source metal to the body well (not shown).

Figure 3D:
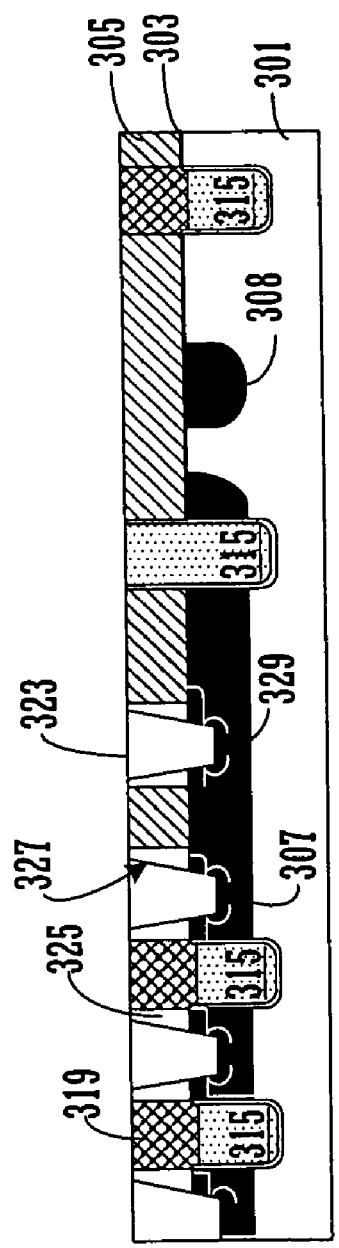
FIG. 3D illustrates the formation of self aligned contact trenches according to one embodiment of the present invention.

FIG. 3D illustrates the formation of self aligned contact trenches according to one embodiment of the present invention. FIG. 3D shows in addition to the structures enumerated in the discussion of FIGS. 3A-3C above, oxide spacers 325, contact trenches 327, and contact implant 329. According to one embodiment, oxide spacers 325 may be created along the walls of the contact windows (e.g., 323 FIG. 3C) by a process sequence that includes the provision of an oxide CVD film and an anisotropic etch back by an RIE process. In the contact areas 327, the Silicon surface may be etched using a subsequent RIE step. Thereafter, a shallow trench may be etched through the entire depth of the source region and a subsequent contact implant 329 formed to increase the dopant concentration in the body well at the contact interface. Source regions may be contacted along the side walls of the contact trenches 327 (see FIG. 3E).

Figure 3E:
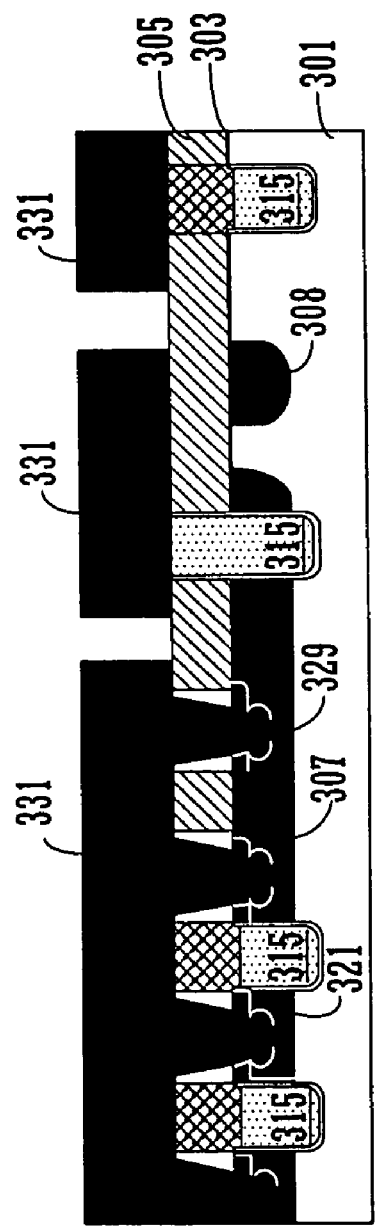
FIG. 3E shows the final device structure after metal deposition and patterning according to one embodiment of the present invention.

FIG. 3E shows the final device structure after metal deposition and patterning of metallized contacts 331 according to one embodiment of the present invention. The described process flow resulted in a self aligned formation of metallized contacts 331 to the active areas of the transistor in the mesa regions between the trenches, and to the polysilicon gate material occupying the trench network.

It should be appreciated that the final device structure according to exemplary embodiments of the present invention features a trench gated arrangement. As is shown in FIG. 3E, in the final device structure, the polysilicon material occupying the trenches located in the active device and gate bus areas, may be formed to different levels. In the active device area the polycrystalline silicon (which may be used as the gate material) occupying the trenches may be recessed below the level of the front surface of the silicon substrate and may be isolated from the overlying source metal by an insulator. However, in the gate bus region, the polysilicon occupying the trench located there extends above the front surface of the substrate and creates a plug through the field oxide layer. According to exemplary embodiments, the top of the plug thusly situated makes electrical contact with the metal contact forming the gate bus. The trenches in the active device and gate bus areas form a continuous grid, so that the polysilicon that occupies these trenches form a common gate electrode.

According to exemplary embodiments, semiconductor devices made in the polycrystalline silicon layer may be integrated onto a single chip along with the main transistor. This can be accomplished where the polysilicon film is placed in a wide trench and is isolated from the main transistor by an oxide film lining the trench walls (as is described herein with reference to FIGS. 4A-4E). According to such embodiments, a top surface of the polysilicon material occupying the wide trench may be recessed below the front surface of the substrate and may then be covered by an insulator film. Segments of the polysilicon film that are not recessed constitute plug contacts that straddle the insulator and possess surfaces that may be coincident with the surface of the substrate. These plugs may subsequently be contacted with dedicated metal electrodes that form electric terminals of the semiconductor devices formed in the polysilicon layer. In addition, as previously mentioned, in exemplary embodiments of the present invention a flat surface may be provided for all critical exposures of the photoresist masks (as described herein), facilitating the production of high density, fine patterned structures, while avoiding problems related to the fine alignment of the exposure tool that may arise when patterning surfaces that present significant height variance. Exemplary embodiments also provide a methodology for making self-aligned contact to the mesas between the trenches as is described herein.

Figure 4A:
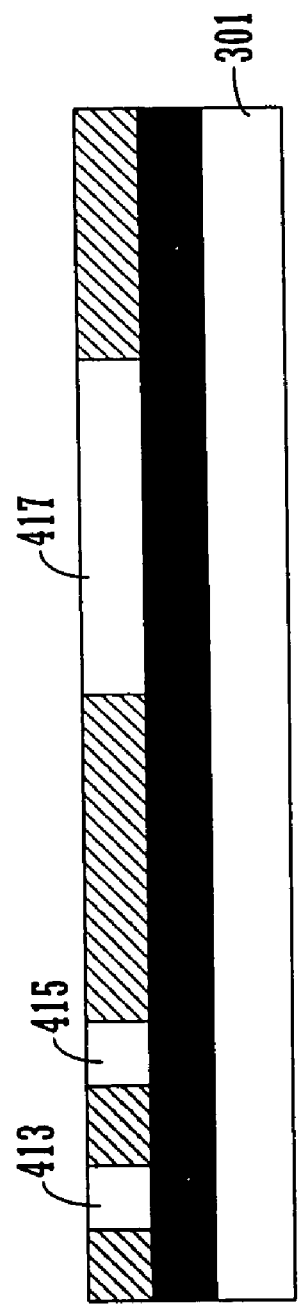
FIG. 4A shows a substrate patterned with a hard mask for facilitating the etching of trench grooves according to one embodiment of the present invention.

FIGS. 4A-4E illustrate a MOSFET fabricating process featuring the provision of self aligned contacts in accordance with one embodiment of the present invention. FIG. 4A shows a substrate patterned with a hard mask ($2^{nd}$ photo resist mask) for facilitating the etching of trench grooves according to one embodiment of the present invention. A first photo resist mask (not shown) may be employed to define the structure of the edge termination components of the device. FIG. 4A shows substrate 401, pad oxide layer 403, silicon nitride film 405, and mask openings 413, 415, and 417. Substrate 401 provides support for the formation of device components. According to exemplary embodiments, silicon substrate 401 provides the base material from which a MOSFET may be formed. Together silicon nitride film 405, and pad-oxide layer 403, form a hard mask including mask openings 413, 415, and 417 that can facilitate the etching of trench grooves (see FIG. 4B).

Figure 4B:
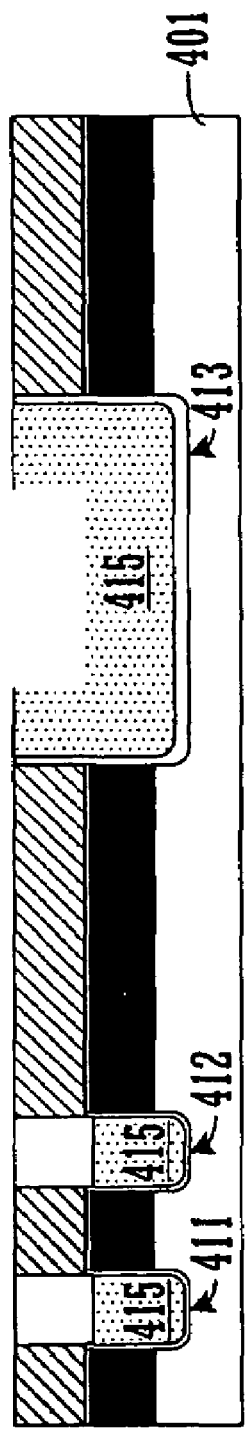
FIG. 4B illustrates a trench formation process according to one embodiment of the present invention.

FIG. 4B illustrates a trench formation process according to one embodiment of the present invention. FIG. 4B shows in addition to the structures enumerated in the discussion of FIG. 4A, active area trenches 411 and 412, wide trench 413, polycrystalline film 415, and oxide film 417. According to exemplary embodiments, a dry etching process utilizing both body and trench masks may be employed in the formation of active area trenches 411 and 412, and wide trench 413. According to one embodiment, a reactive ion etching (RIE) process may be employed to form the trenches. After the trenches have been formed, a deposition of oxide film 417 deposited to line the trench walls may be performed. A polycrystalline film 415 may then be deposited over the gate oxide film 417 to fill the trench grooves and to form the electrode material occupying the trenches. According to exemplary embodiments, the polysilicon material then occupying the wide trench 413 may be isolated from the main transistor by the oxide film 417 deposited to line the walls of the wide trench. According to such embodiments, excess polysilicon may be removed from the surface of the SiN layer 405 of the hard mask and the exposed polysilicon surface planarized in a CMP operation. This results in a flat polysilicon surface coincident with the top surface of the nitride.

A photoresist mask (third) may then be applied to the resultant flat surface to distinguish between the active area of the main MOSFET and other circuit areas. The polysilicon film 415 is thereafter recessed below the front surface of the silicon substrate in the main MOSFET region by selective dry etching. This leaves the polycrystalline film 415 occupying the active area trenches 411 and 412, and the wide trench 413 recessed. The structure shown in FIG. 4B is arrived at after the application of the active mask and a subsequent etch back of the polysilicon.

Figure 4C:
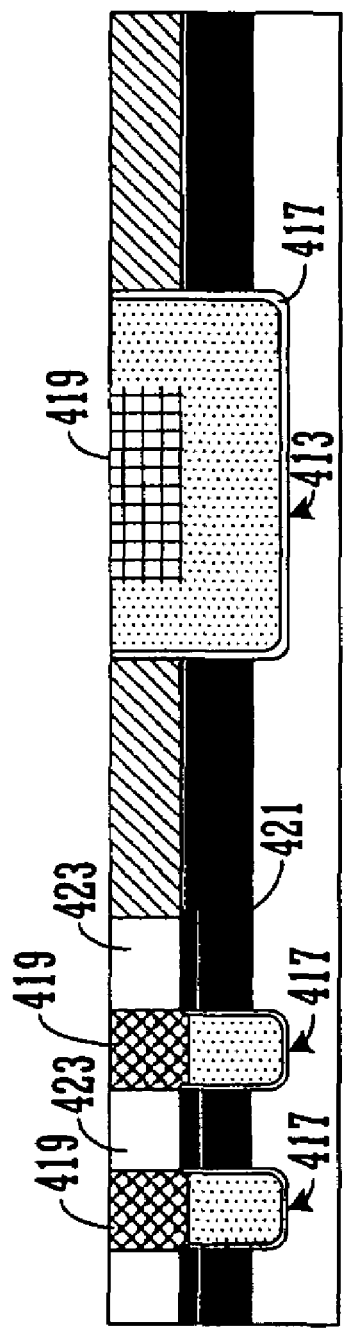
FIG. 4C illustrates a process for providing implants and contact windows according to one embodiment of the present invention.

FIG. 4C illustrates a process for providing implants and contact windows according to one embodiment of the present invention. FIG. 4C shows in addition to structures enumerated in the discussion of FIGS. 4A and 4B above, insulator film 419, source regions 421, and contact windows 423. Insulator film 419 may be deposited and subsequently planarized by CMP processes. The deposition of the insulator film fills the voids above the recessed polysilicon. The insulator film may then be planarized in a second CMP process. A fourth photo resist mask may be applied to define contact windows 423 that may be opened in the nitride layer to facilitate the implantation of source regions 421. In the active area, the SiNi film may be selectively etched away leaving oxide buttons to cover the trenches (see FIG. 4C). The opened contact windows 423 may be used to facilitate the implantation of source regions 421 and to implant an additional body dose to fix the threshold voltage. This may be required after a dopant redistribution between silicon and gate oxide that can occur at the trench walls. Implanted source and body dopants may be electrically activated using an RTA process (Rapid Thermal Annealing). According to one embodiment, implantation windows can also be opened some distance from the trenches, to enable the remote contacting of the source metal to the body well. Moreover, PN junctions can be formed in the polysilicon film by respective implantation steps.

Figure 4D:
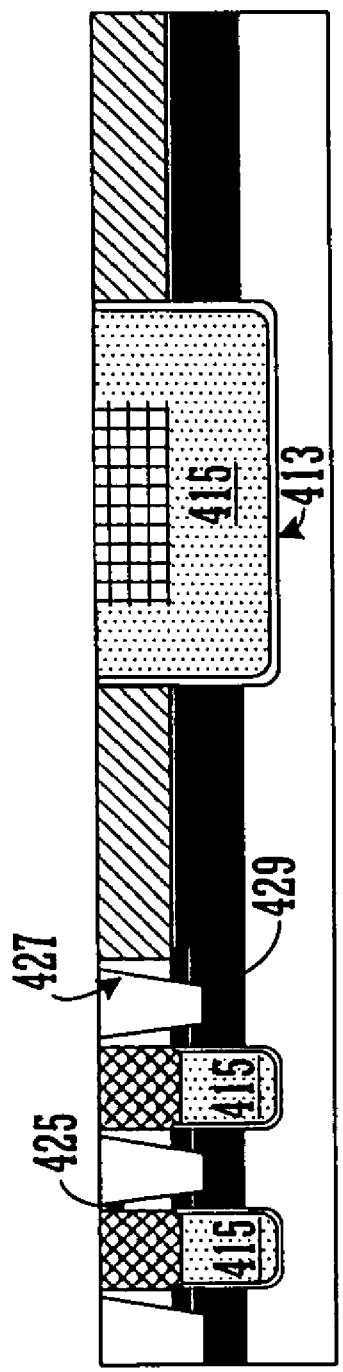
FIG. 4D illustrates a process for providing self aligned contacts according to one embodiment of the present invention.

FIG. 4D illustrates a process for providing self aligned contacts according to one embodiment of the present invention. FIG. 4D shows in addition to the structures enumerated in the discussion of FIGS. 4A-4C above, oxide spacers 425, contact trenches 427, and contact implants 429. Oxide spacers 425 are created along the walls of the contact windows (e.g., 423 FIG. 4C) by a process sequence that includes the provision of an oxide CVD film and an anisotropic etch back by an RIE process. In the contact areas, the Silicon surface may be etched using a subsequent RIE step. Thereafter, a shallow trench may be etched through the entire depth of the source region and a contact implant 429 formed to increase the dopant concentration in the body well at the contact interface. Source regions may be contacted along the sidewalls of the contact trenches 427.

Figure 4E:
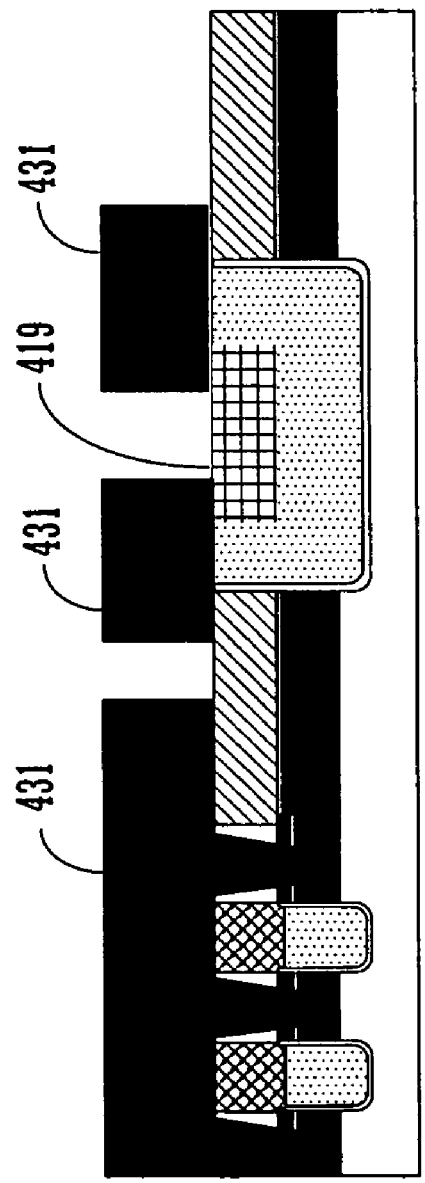
FIG. 4E shows a final semiconductor device structure fabricated in accordance with one embodiment of the present invention.

FIG. 4E shows a final semiconductor device structure fabricated in accordance with one embodiment of the present invention. FIG. 4E depicts the final device structure after the deposition and patterning of metallized contacts 431. The electrodes of the device formed in the polycrystalline film occupying the wide trench maybe contacted by aligned structures such as that represented by the metallized contacts 431 of the main transistor. The polysilicon diodes placed within the wide trench can be used as ESD diodes to protect the gate terminal of the main MOSFET against electrostatic discharges, or as temperature sense devices integrated with the main transistor.

Embodiments of the present invention facilitate the easy integration of polysilicon devices (e.g., diodes) that may be placed on the surface of a substrate and may need to be electrically isolated from the main MOSFET. As previously mentioned, the polysilicon material used to form the diodes may be placed within a wide trench well. This material may be isolated from the silicon substrate by an oxide film and may be formed to exhibit a thickness equal in dimension to the trench depth. This may be accomplished during CMP operations that results in the removal of excess polysilicon from the surface of the hard mask.

According to one embodiment, the integrated polysilicon device may be isolated from the main transistor by a thin gate oxide film in the final device structure. This facilitates the integration of polysilicon diodes that may be employed as temperature sensors. However, if the polysilicon diode may be used as protection against gate oxide damage by electrostatic discharge (ESD protection), the oxide isolation structure needs to be much thicker than the gate oxide film. Such a structure may be provided by first etching and oxidizing the trenches formed in the active area, and subsequently etching and oxidizing the wide trench used in the integration of the polysilicon diode, in two independent process steps. Such a process formulation may be more complex and expensive, but may be easily performed.

Figure 5:
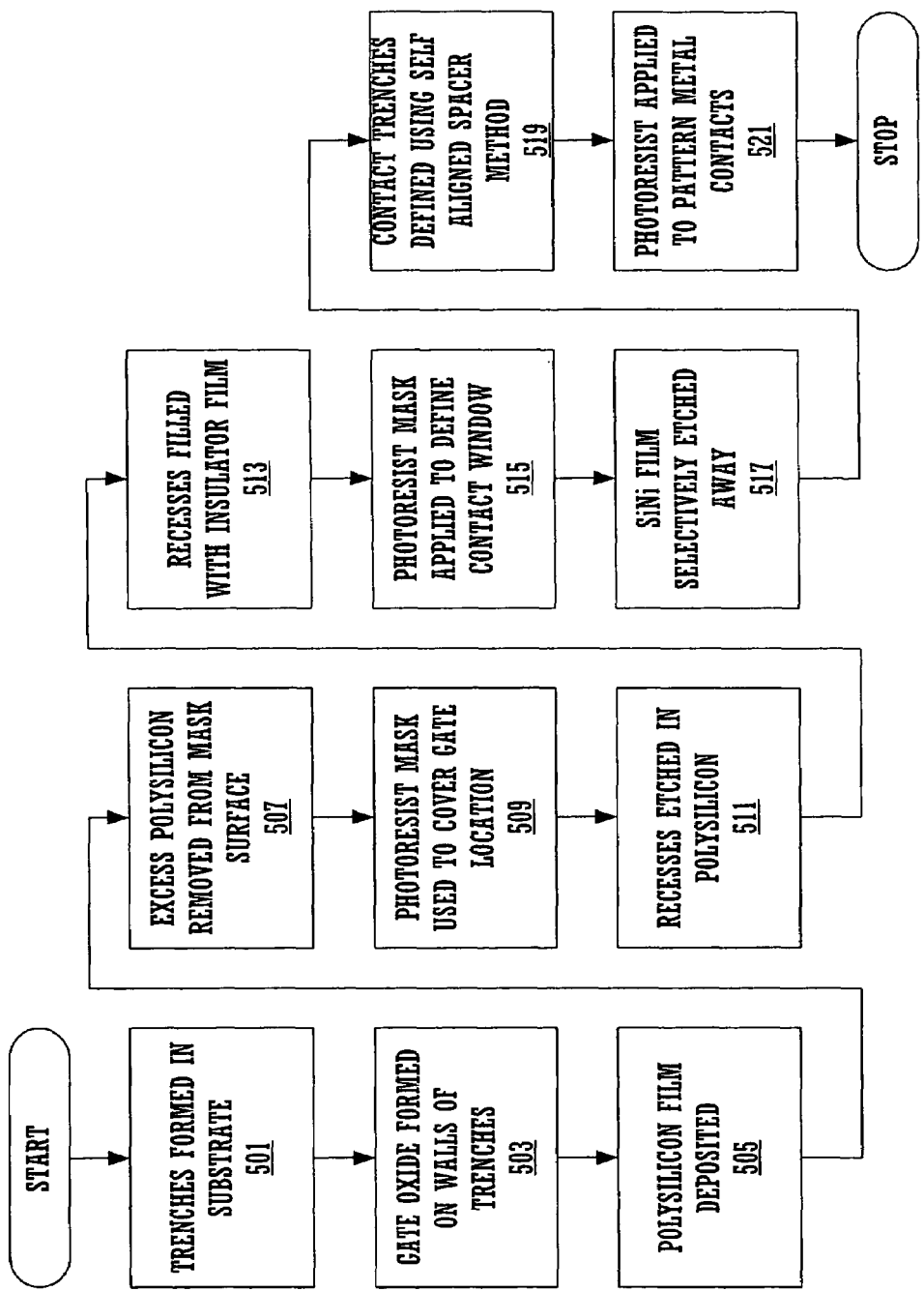
FIG. 5 shows a flow diagram of a method for providing self aligned contacts in a trench power MOSFET according to one embodiment of the present invention.

FIG. 5 shows a method for providing self aligned contacts in a trench power MOSFET according to one embodiment of the present invention. According to such embodiments, a flat surface may be provided for all critical exposures of the photoresist masks (as described herein), which facilitates the production of high density, fine patterned structures, while avoiding problems related to the fine alignment of the exposure tool that may arise when patterning surfaces that present significant height variance.

At step 501, trenches are formed in a substrate through a mask of silicon nitride deposited on an oxide layer. According to exemplary embodiments, a dry etching process may be employed in the formation of the trenches. According to one embodiment, a reactive ion etching (RIE) process may be employed to form the trenches.

At step 503, a gate oxide layer is formed on the walls of the trenches formed in step 501. After the trenches are formed, a deposition of a gate oxide 317 lining the trench walls may be performed. At step 505, polysilicon is used to fill the trenches and to cover the surface of the mask of silicon nitride (see step 501). This may be accomplished by depositing a polycrystalline film over the gate oxide layer (e.g., 317) to fill the trench grooves with gate material.

At step 507, excess polysilicon is removed from the surface of the mask of silicon nitride (SiN). According to one embodiment, excess polysilicon may be removed from the surface of the SiN layer (e.g., 305) of the hard mask by CMP, leaving a flat surface coincident with the top surface of the SiN layer.

At step 509, a photoresist mask is provided to cover a future location of a gate bus. The photoresist mask may be applied to distinguish between the active area of the main MOSFET and a future gate bus area.

At step 511, the polysilicon plugs (e.g., polysilicon film 315) formed in the trenches that are located in the active area are etched to form recesses in the area located above the polysilicon plugs. According to exemplary embodiments, the polysilicon plugs (e.g., polysilicon film 315) may be recessed below the front surface of the silicon substrate in the main MOSFET region by selective dry etching. This leaves the polycrystalline film (e.g., 315) occupying the active area trenches (e.g., 311) recessed while the polycrystalline film (e.g., 315) that occupies the gate area trench (e.g., 313) remains coincident with the top surface of the SiNi layer (e.g., 305) of the hard mask.

At step 513, the recesses formed above the polysilicon plugs formed in the trenches that are located in the active area are filled with an insulator film (e.g., 319). According to exemplary embodiments, insulator film 319 may be deposited and then planarized by CMP processes resulting in a filling of the voids above the recessed polysilicon. After excess material is removed by CMP processes, the flat surface of the hard mask is exposed.

At step 515, a fourth photo resist mask is applied to define contact windows (e.g., 323) that may be opened in the nitride layer. These windows facilitate the implantation of semiconductor device source regions (e.g., 321). In the active area, at step 517, the SiN film may thereafter be selectively etched away leaving the flat surfaced oxide buttons to cover the trenches that are located there (see FIG. 3C).

At step 519, electrical contact trenches are defined using a self-aligned spacer method (see FIG. 6). And, at step 521, a fifth photo resist mask is applied to pattern metal contacts that are configured (e.g., by deposition, etc.) to reach the semiconductor device active areas. According to exemplary embodiments, the above described process provides a self aligned formation of contacts to the active areas of the transistor mesa regions between semiconductor device trenches, and to the polysilicon constituting the gate material that occupies the semiconductor device trenches.

FIG. 6 is a flowchart of steps performed in providing a self aligned spacer method according to one embodiment of the present invention. According to exemplary embodiments, the method facilitates the provision of self aligned contacts to the source regions of a semiconductor device.

At step 601, oxide spacers (e.g., 325) are created along the walls of contact windows (e.g., 323). According to exemplary embodiments, oxide spacers are created by the deposition of an oxide CVD film coupled with an anisotropic etch back of the oxide film by an RIE process.

At step 603, in the contact areas, the silicon surface is etched in a second RIE operation. According to exemplary embodiments, the surface is etched to form a shallow trench that extends through the source region. And, at step 605, a contact implant is formed at the bottom of the trench to increase the dopant concentration in the body well at the contact interface. It should be appreciated that the source region may be contacted along the side walls of the contact trenches by a metal contact (see step 521, FIG. 5).

As noted above with reference to exemplary embodiments thereof, the present invention provides a method for providing self aligned contacts in a trench power MOSFET. The method includes, etching trenches in a substrate through a mask of silicon nitride deposited on an oxide layer, forming a gate oxide layer on the walls of the trenches, applying polysilicon to fill the trenches and to cover the surface of the mask of silicon nitride, applying a photoresist mask to cover a location of a gate bus and removing the polysilicon from the surface of the mask of silicon nitride. The method further includes recessing polysilicon plugs formed in trenches that are located in the active area to form recesses above the polysilicon plugs, filling recesses formed above the polysilicon plugs formed in trenches that are located in the active area with an insulator, applying a fourth photo resist mask to define contact windows that are opened in the nitride layer, and selectively etching the silicon nitride film and leaving flat surfaced oxide buttons covering the trenches that are located in the active area. Moreover, electric contact trenches are defined using self-aligned spacer operations, and a fifth photo resist mask is applied to pattern metal contacts that contact the semiconductor device active areas.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for providing self aligned contacts in an integrated MOSFET arrangement that includes an active area and a gate bus area comprising:

providing a semiconductor substrate having a first surface and forming a plurality of semiconductor devices that are accessible at said first surface of said semiconductor substrate;

forming contact windows in said substrate;

forming a mask of silicon nitride on said substrate;

forming polysilicon material on a surface of said mask of silicon nitride that forms a polysilicon plug in said gate bus area;

forming an insulator on said mask of silicon nitride;

forming a gate bus in said gate bus area;

creating oxide spacers along walls of said contact windows formed in said substrate and etching said first surface of said substrate surface to form a contact trench in a RIE operation; and forming a contact implant at the bottom of said contact trench to increase the dopant concentration in a body well at a contact interface, wherein source regions of said integrated MOSFET arrangement are contacted along side walls of said contact trench.

2. The method of claim 1, further comprising providing access to the top of said polysilicon plug formed in said gate bus area.

3. The method of claim 2, further comprising removing said polysilicon material from said surface of said mask of silicon nitride in a CMP (chemo mechanical polishing method) operation.

4. The method of claim 3, further comprising applying a photoresist mask that covers said gate bus area.

5. The method of claim 4, wherein said polysilicon plug has a height in said gate bus area that is coincident with the surface of said mask of silicon nitride.

6. The method of claim 5, wherein said insulator is etched selectively with regard to said mask of silicon nitride.

7. The method of claim 6, wherein said insulator comprises oxide or BPSG.

8. The method of claim 2, further comprising making electrical contact with said polysilicon plug to form said gate bus.

9. The method of claim 8, further comprising etching a wide trench in said substrate.

10. The method of claim 9, wherein said wide trench is filled with a polycrystalline film that has a semiconductor device formed therein.

* * * * *